United States Patent [19]
Chen

[11] Patent Number: 6,104,074
[45] Date of Patent: Aug. 15, 2000

[54] SCHOTTKY BARRIER DETECTORS FOR VISIBLE-BLIND ULTRAVIOLET DETECTION

[75] Inventor: Qisheng Chen, Lino Lakes, Minn.

[73] Assignee: APA Optics, Inc., Blaine, Minn.

[21] Appl. No.: 09/206,328

[22] Filed: Dec. 8, 1998

Related U.S. Application Data

[60] Provisional application No. 60/069,291, Dec. 11, 1997, provisional application No. 60/069,255, Dec. 11, 1997, provisional application No. 60/069,295, Dec. 11, 1997, provisional application No. 60/069,293, Dec. 11, 1997, and provisional application No. 60/069,328, Dec. 11, 1997.

[51] Int. Cl.[7] .......................... H01L 31/00; H01L 31/07; H01L 31/109; H01L 31/0328; H01L 31/0336
[52] U.S. Cl. .................. 257/453; 257/184; 257/449; 257/472; 257/473
[58] Field of Search .................................. 257/184, 201, 257/449, 453, 459, 466, 472, 473, 485

[56] References Cited

U.S. PATENT DOCUMENTS

| | | |
|---|---|---|
| 5,192,987 | 3/1993 | Khan et al. . |
| 5,278,435 | 1/1994 | Van Hove et al. . |
| 5,296,395 | 3/1994 | Khan et al. . |
| 5,625,202 | 4/1997 | Chai ........................... 257/94 |
| 5,923,049 | 7/1999 | Bohm et al. ............... 257/55 |

OTHER PUBLICATIONS

Chen, Q. et al., "Visible–blind ultraviolet photodetectors based on GaN p–n junctions", *Electronics Letters*, 31(20):1781–1782 (Sep. 28, 1995).

Chernyak, L. et al., "Electron beam induced current measurements of minority carrier diffusion length in gallium nitride", *Applied Physics Letters*, 69(17):2531–2533 (Oct. 21, 1996).

Guo, J.D., "Study of Schottky barriers on n–type GaN grown by low–pressure metalorganic chemical vapor deposition", *Applied Physics Letters*, 67(18):2657–2659 (Oct. 30, 1995).

Khan, M.A. et al., "High–responsivity photoconductive ultraviolet sensors based on insulating single–crystal GaN epilayers", *Applied Physics Letters*, 60(23):2917–2919 (Jun. 8, 1992).

Khan, M.A. et al., "Photoluminescence characteristics of AlGaN–GaN–AlGaN quantum wells", *Applied Physics Letters*, 56(13):1257–1259 (Mar. 26, 1990).

Khan, M.A. et al., "Schottky barrier photodetector based on Mg–doped p–type GaN films", *Applied Physics Letters*, 63(18):2455–2456 (Nov. 1, 1993).

Lim, B.W. et al., "High responsivity intrinsic photoconductors based on $Al_xGa_{1-x}N$", *Applied Physics Letters*, 68(26):3761–3762 (Jun. 24, 1996).

Mohammad, S.N. et al., "Reactive Molecular–Beam Epitaxy for Wurtzite GaN", *MRS Bulletin*, 22(2):22–28 (Feb. 1997).

Morkoc, H. et al., "Large–band–gap SiC, III–V nitride, and II–VI ZnSe–based semiconductor device technologies", *Journal of Applied Physics*, 76(3):1363–1398 (Aug. 1, 1994).

Nakamura, S. et al., "High–brightness InGaN/AlGaN double–heterostructure blue–green–light–emitting diodes", *Journal of Applied Physics*, 76(12):8189–8191 (Dec. 15, 1994).

(List continued on next page.)

*Primary Examiner*—Ngân V. Ngô
*Attorney, Agent, or Firm*—Merchant & Gould P.C.

[57] ABSTRACT

The invention concerns the fabrication and characterization of vertical geometry transparent Schottky barrier ultraviolet detectors based on $n^-/n^+$-GaN and AlGaN structures grown over sapphire substrates. Mesa geometry devices of different active areas were fabricated and characterized for spectral responsivity, speed and noise characteristics. The invention also concerns the fabrication and characterization of an 8×8 Schottky barrier photodiode array on GaN with a pixel size of 200 μm by 200 μm.

20 Claims, 13 Drawing Sheets

OTHER PUBLICATIONS

Nakamura, S. et al., "InGaN–Based Multi–Quantum–Well–Structure Laser Diodes", *Japanese Journal of Applied Physics*, 35(1B):L74–L76 (Jan. 15, 1996).

Qian, W. et al., "Microstructural characterization of α–GaN films grown on sapphire by organometallic vapor phase epitaxy", *Applied Physics Letters*, 66(10):1252–1254 (Mar. 6, 1995).

Schmitz, A.C. et al., "Schottky barrier properties of various metals on n–type GaN", *Semiconductor Science and Technology*, 11(10):1464–1467 (Oct. 1996).

Stern, F. et al., "Electron energy levels in GaAs–Ga$_{1-x}$Al$_x$As heterojunctions", *Physical Review B*, 30(2):840–848 (Jul. 15, 1984).

Walker, D. et al., "GaN ultraviolet phtoconductors grown on sapphire", A;;, *Applied Physics Letters*, 68(15):2100–2101 (Apr. 8, 1996).

SCHOTTKY BARRIER DETECTORS FOR VISIBLE-BLIND ULTRAVIOLET DETECTION

RELATED APPLICATIONS

This application claims priority from U.S. Provisional Patent Applications Nos. 60/069,291; 60/069,255; 60/069,295; 60/069,293; and 60/069,328; all filed Dec. 11, 1997.

FIELD OF THE INVENTION

The invention relates generally to Schottky barrier detectors and more specifically to Schottky barrier detectors formed on gallium nitride and on aluminum gallium nitride for use in ultraviolet detection. The invention further relates to photodiode arrays and more specifically to gallium nitride Schottky barrier photodiode arrays for ultraviolet imaging.

INTRODUCTION

Visible-blind UV detectors have great potential in applications such as UV radiometry, flame sensing and missile guidance systems. Currently, photocathodes are the only devices capable of addressing these applications. Unfortunately, these are bulky, difficult to integrate with control electronics and in general, require high operating voltages. Intrinsic detectors based on gallium nitride (GaN), with a room temperature bandgap of 3.43 eV (electron volts) can be a good alternative to photocathodes for such applications.

$Al_xGa_{1-x}N$ is compound semiconductor that is ideally suited for devices in the visible and the ultraviolet parts of the spectrum. Aluminum gallium nitride has a direct bandgap which is tunable from 3.4 electron volts (or 365 nanometers) at x=0 to 6.2 electron volts (or 200 nanometers) at x=1. This makes the material ideally suited for intrinsic ultraviolet sensors with high responsivities for wavelengths shorter than 365 nanometers and essentially no photosensitivity for longer wavelengths. Such sensors can there for detect ultraviolet emissions from flames in the presence of hot backgrounds (such as infrared emission from the hot bricks in a furnace).

Gallium nitride is a wide, direct bandgap semiconductor which has a broad range of potential applications for optoelectronic and high power/temperature electronic devices. A number of devices have been demonstrated, including high power, short wavelength (blue, violet) light emitting diodes or LED's, ultraviolet photoconductive detectors, ultraviolet Schottky Barrier Detectors, metal-semiconductor field effect transistors or MESFETS, high electron mobility transistors or HEMTS and heterojunction bipolar transistors or HPTs.

Previously, epitaxial films of gallium nitride have been grown by several growth techniques, such as organo metallic vapor phase epitaxy (OMVPE) and molecular beam epitaxy (MBE) using sapphire ($Al_2O_3$) as the most common substrate. As-grown gallium nitride films are known to contain a high density of defects (mainly threading dislocations), due to the large lattice mismatch and thermal expansion coefficient difference between the epilayer and the substrate. These defects affect both electrical and optical properties of the material, e.g., broken bonds at defect sites may enhance free carrier combination. A low temperature of aluminum nitride or Gallium nitride buffer layer considerably improves the crystal quality of the gallium nitride epilayers, but recently reported films still contain a defect density of about $2 \times 10^{10}$ $cm^{-2}$.

In the past, several groups have reported on gallium nitride/aluminum gallium nitride based ultraviolet detectors, including photoconductive, Schottky Barrier, and p-n-junction ultraviolet detectors based on gallium nitride single layers or p-n-junctions. These photo conductor devices were all of lateral geometry and suffer from several problems. For example, for photoconductors with gains of 1000, the reported bandwidth has only been around 1 kHz, which makes them too slow for many applications. This response speed problem becomes more severe with the addition of aluminum in the active layer.

The lateral Schottky Barrier devices prepared on p-doped gallium nitride were also slow because of the large series resistance of the p-type layer resulting from the lower carrier mobility and in concentration achievable. Further, for the Schottky devices, back illumination through the transparent sapphire substrate side was required. This resulted in poor quantum efficiencies because of light absorption at the gallium nitride-sapphire interface region where a very high dislocation density exists.

As a result, a need exists for an improved Schottky barrier detectors for visible-blind ultraviolet detection.

BRIEF DESCRIPTION OF THE INVENTION

In accordance with a first aspect of the invention, there is provided a vertical geometry transparent Schottky barrier detector capable of detecting electromagnetic radiation in the range of 200 to 350 nm. This detector has several layers grown over basal plane sapphire substrates, including a buffer layer comprising AlN; a n+doped layer comprising $Al_aGa_{1-x}N$; a n−doped layer comprising $Al_xGa_{1-x}N$; and, a Schottky layer comprising palladium. The detector also has ohmic contacts formed on the bottom doped layer.

In accordance with a second aspect of the invention, there is provided an array of mesa type transparent Schottky barrier detectors suitable for visible-blind imaging. In the array, each detector has several layers grown over basal plane sapphire substrates, including a buffer layer comprising AlN; a n+ doped layer comprising $Al_xa_{1-x}N$; a n− doped layer comprising $Al_xGa_{1-x}$ N; and, a Schottky layer comprising palladium. Each detector also has ohmic contacts formed on the bottom doped layer.

DETAILED DESCRIPTION OF THE INVENTION

The invention includes a vertical geometry transparent Schottky barrier detector capable of detecting electromagnetic radiation in the range of 200 to 350 nm. The detector has several layers grown over basal plane sapphire substrates, including a buffer layer comprising AlN; a $n^+$ doped layer comprising $Al_xGa_{1-x}N$; a $n^-$ doped layer comprising $Al_xGa_{1-x}N$; and, a Schottky layer comprising palladium; the detector further includes ohmic contacts formed on the bottom doped layer. In the formula $Al_xGa_{1-x}N$, x can range from 0 to 1. In a first embodiment, x is preferably equal to zero. In a second embodiment, x is greater than zero. The exact value of x is determined by the long wavelength cutoff needed for the particular application.

Figure 1A:
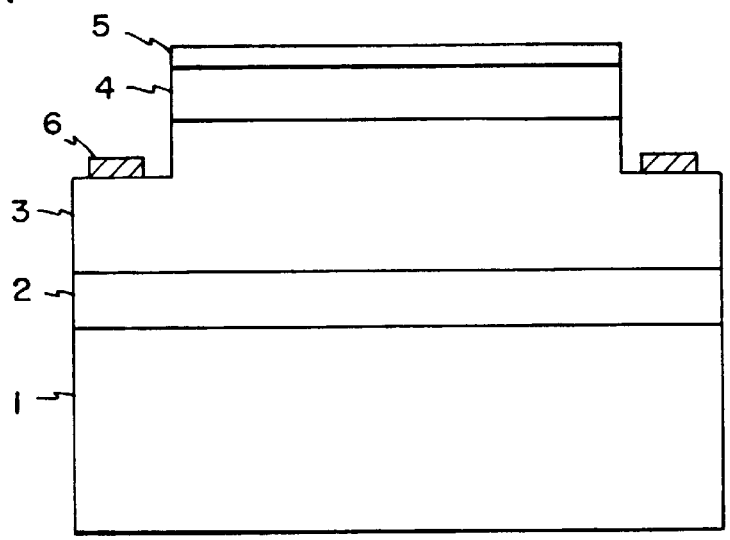
FIG. 1A is a schematic illustration of a detector according to the invention.
Figure 1B:
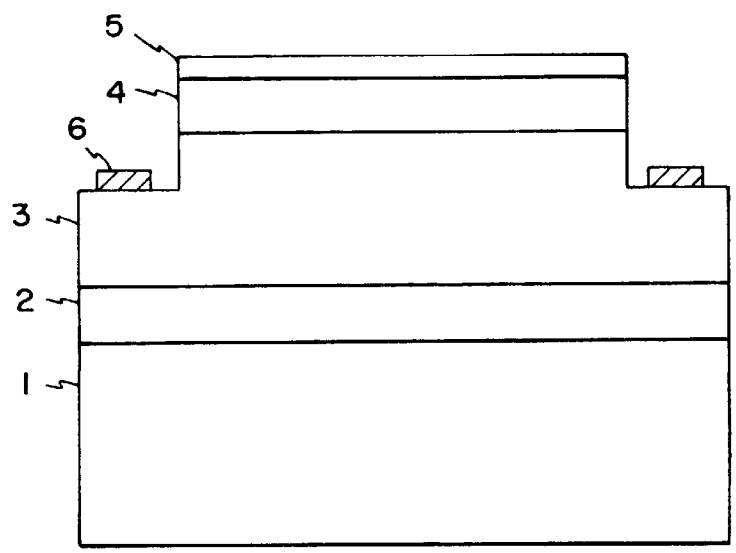
FIG. 1B is a schematic illustration of an alternate embodiment of the invention.

Referring to the drawings wherein like numerals represent like parts throughout several views, there is generally shown an $Al_xGa_{1-x}N$ ultraviolet detector in FIGS. 1A and 1B. FIG. 1A shows a detector comprising a single crystal substrate 1, a buffer or matrix layer 2, a $n^+$ doped layer 3, a $n^-$ doped active layer 4, a Schottky layer 5 and ohmic contacts 6. In this embodiment, x is equal to 0 in $Al_xGa_{1-x}N$.

FIG. 1B shows an alternative embodiment in which x is greater than 0, so that the doped layers comprise $Al_xGa_{1-x}N$.

Generally, the first layer of the ultraviolet detector is a substrate 1. The substrate functions as a seed for the growth of further layers of the detector as well as a physical support for the detector. Any number of compositions can be used as the substrate, but sapphire is preferred. More preferable is the use of single crystal basal plane sapphire.

This is available commercially in single crystal form and serves well as a template for the growth of further layers of the detector. Further, basal plane sapphire is generally transparent to ultraviolet energy.

In order to ease the lattice mismatch between the substrate and the subsequent epitaxial layers, the ultraviolet detector of the invention may also comprise a buffer layer 2. Generally, this buffer layer comprises aluminum nitride and is about 10 to 50 nm, preferably about 40 nm thick.

A layer of $n^+$ doped $Al_xGa_{1-x}N$ is generally deposited over the AlN buffer layer. Preferably, this $Al_xGa_{1-x}N$ layer is single crystal and serves as a substrate for the active $Al_xGa_{1-x}N$ layer 4 which can also be deposited by atomic layer epitaxy. Generally the $n^+$ doped $Al_xGa_{1-x}N$ layer 3 may range in thickness from about 0.5 to 1.5 μm, preferably about 1.2 μm.

The ultraviolet detector of the invention also comprises an $n^-$ doped $Al_xGa_{1-x}N$ active layer 4. The function of this layer is to absorb and collect ultraviolet signals at a high responsivity rate. Preferably, this layer is single crystal and ranges in thickness from about 0.3 to 1.5 μm, preferably about 0.7 μm. If the single crystal active $Al_xGa_{1-x}N$ layer is too thin, it will not absorb all of the incident ultraviolet energy. If too thick, by contrast, the detector will not be able to collect enough ultraviolet energy to drive or create a response.

The ultraviolet detector of the invention also comprises a Schottky layer 5 comprising palladium. Preferably, this layer is about 2 to 5 nm, preferably about 3.5 nm thick.

The detector also comprises several ohmic contacts 6 which preferably comprise either Ti/Al/Au or Ti/Al.

FABRICATION OF DETECTOR

Figure 2A:
FIGS. 2A through 2F are schematic illustrations of the step-by-step processing used to make the detector.
Figure 2B:
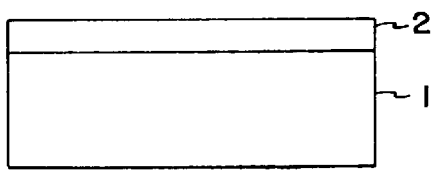
Figure 2C:
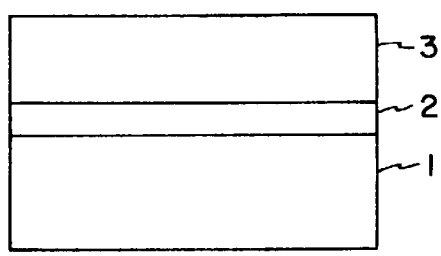

The fabrication process is seen schematically in FIGS. 2A through 2F. The detectors are grown on basal plane sapphire, or $Al_2O_3$. In fabricating the detector of the invention, a sapphire substrate 1 as seen in FIG. 2A may be placed on a SiC coated graphite susceptor and heated with rf induction. The matrix layer 2 may then be grown by MOCVD or ALE. Preferably, this layer may be deposited via conventional metal organic chemical vapor deposition (MOCVD) and generally may be deposited in single crystal form. Generally, this buffer layer may be grown to a thickness of about 10 to 50 nm, preferably about 30 nm and is represented schematically in FIG. 2B.

The aluminum nitride buffer layer 2 is deposited at a thickness ranging from about 10 to 50 nm, preferably about 30 nm is deposited at about 600° C. through conventional MOCVD processes.

Figure 2D:
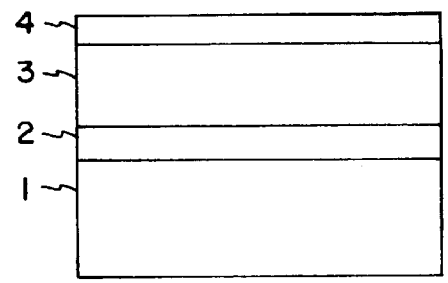
Figure 2E:
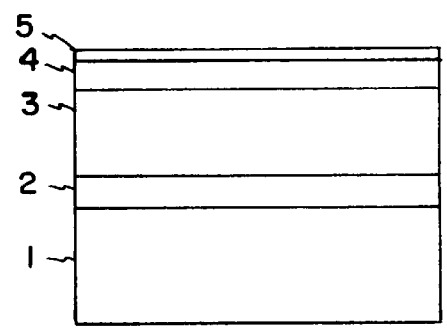
Figure 2F:
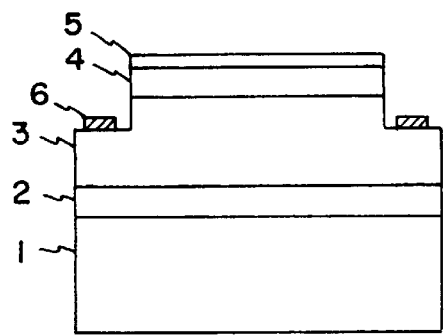

Once the aluminum nitride layer is grown, a layer 3 of $n^+$ doped $Al_xGa_{1-x}N$ may be grown. In practice, this layer may be deposited through standard MOCVD processes at about 76 torr pressure and at temperatures ranging from about 900 to 1200° C., preferably about 1000° C. This layer is represented schematically in FIG. 2C. The $n^+$ doped layer is preferably created using disilane as the dopant, with a resultant doping level of about $3\times10^{18}$ cm$^{-3}$. Generally, the active layer 4 of $n^-$ doped $Al_xGa_{1-x}N$ is grown as a single crystal through conventional MOCVD and atomic layer epitaxy, as represented in FIG. 2D.

This layer is preferably doped with Si to a doping level of about $3\times10^{18}$cm$^{-3}$. The growth temperature generally ranges from about 900 to 1200° C., preferably about 1000° C. The growth temperature may be monitored by a thermocouple inserted in the susceptor.

Source gases for gallium include any number of common gallium sources such as trimethyl or triethylgallium. Other source gases include triethylaluminum and for nitrogen, any number of nitrogenous sources including ammonia. Carrier gases may comprise any number of inert gases such as argon. Hydrogen is preferred as it is readily available commercially and is generally clean. Growth pressures may range from about 50 torr to 200 torr, preferably about 76 torr.

Preferably, the deposition system is capable of switched operation under computer control. In this mode, the precursors may be introduced into the growth chamber in a cyclic fashion with an adjustable sweepout time between the precursor pulses during ALE. The system preferably also allows for simultaneous introduction of the precursors. One means of using atomic layer epitaxy is to grow the aluminum gallium nitride through a series of pulses or using a switched deposition process. In each of the pulses, lasting approximately one second, a different gas is flowed into the chamber.

For example, in the first pulse, triethylgallium may be flowed into the chamber. In the second pulse, only the carrier gas, for example hydrogen, is flowed into the chamber. In the third pulse, the nitrogenous source, for example ammonia, may be flowed into the chamber. In the fourth pulse, again only a cleansing flow of hydrogen is flowed into the chamber. In the fifth pulse, an aluminum species may be flowed into the chamber, followed by a sixth pulse of hydrogen. In the seventh pulse, the nitrogenous source is flowed into the chamber, followed by an eighth pulse of hydrogen. Films of varying aluminum concentration may be deposited by varying the order and number of pulses for each respective gas species.

Preferably, the sequence of steps may be continued for several thousand times resulting in an atomic layer epitaxy process which takes over two hours. As one of skill in the art would expect, variation or extension of this growth period may increase the chemical nature and thickness of the active $Al_xGa_{1-x}N$ single crystal layer Further processing steps include deposition of a Schottky layer 5 comprising palladium, as represented schematically in FIG. 2E. Preferably, this layer comprises a 5 nm layer of e-beam evaporated palladium. This results in a palladium layer which has a flat transmission spectrum with about 70% light transmission.

After the final deposition step, the layers are etched to permit placement of the necessary ohmic contacts 6. Preferably, Cl-based reactive ion etching is used. These contacts 6 are created with either Ti/Al/Au or Ti/Al which is annealed at about 800° C. to 900° C. for about 30 seconds. If Ti/Al is used, a preferred ratio is 15 nm Ti/200 nm Al. These contacts 6 are shown schematically in FIG. 2F.

WORKING EXAMPLES

The following examples provide a nonlimiting illustration of the invention.

Example 1

This example concerns the fabrication and characterization of a vertical geometry transparent Schottky barrier detector using $n^-/n^+$-GaN layers grown over sapphire substrates. A transparent Schottky contact allows for the use of front illumination. The vertical geometry $n^-/n^+$-GaN detector also eliminates the series resistance issue yielding detectors with an RC limited performance with a response time as short as 118 ns for a 50 Ω load.

The epilayer structure used for the photodiodes consists of a about 1 gm thick $n^+$ GaN layer ($n=3\times10^{18}cm^{-3}$) followed by a about 0.4 μm thick $n^-$GaN layer ($n=3\times10^{16}-1\times10^{17}$ $cm^{-3}$). The epilayer structure was deposited over basal plane sapphire substrates at 1000° C. and 76 Torr using a low-pressure metal-organic chemical-vapor deposition system (LPMOCVD). Prior to the epilayers, a 40 nm thick buffer layer of AlN was deposited at 600° C. Schottky barrier detectors were then fabricated beginning with the definition of 4 mm by 4 mm mesas using reactive ion etching. The bottom Ohmic contact to the $n^+$ layer was made with e-beam evaporated 15 nm Ti/200 nm Al. The Ohmic contacts were annealed at 800° C. for 30 s. The top Schottky barrier was formed using a 5 nm thick e-beam evaporated Pd metal. The transmission spectrum of this Pd metal coating is nearly flat in the wavelength range of interest (200–365 nm) with approximately 70% of light transmission.

Figure 3:
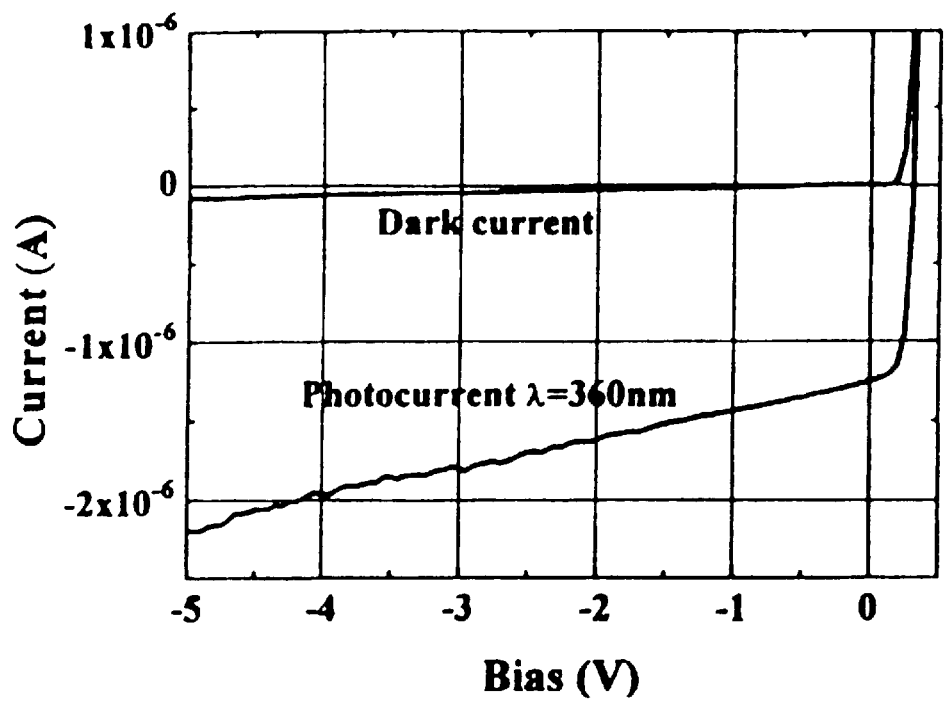
FIG. 3 depicts current-voltage characteristics of the Pd/n−.GaN/n+-GaN/sapphire(1000) Schottky detectors taken in dark (upper trace) and under illumination with X equal to about 360 nm (lower trace).

FIG. 3 shows the current-voltage (I–V) characteristics of the Pd/$n^-$GaN/sapphire(1000) Schottky detectors taken in the dark (upper trace) and under illumination with λ equal to about 360 nm from a monochromator (lower trace). A typical turn-on voltage was about 0.8 V. The transparent Schottky barrier height derived from the temperature dependence of the I–V curves is found to be about 0.9 eV, in good agreement with the value reported for thick Pd Schottky contacts on GaN. Using forward bias characteristics, the saturation current density $J_0$ was estimated to be about $6.3\times10^{-12}$ A/cm$^2$ for the detector area of 4 mm×4 mm.

As seen from FIG. 3, for a device with an $n^-$GaN layer having a doping level of $3\times10^{16}$ cm$^3$, the reverse leakage current is about 80 nA at −5 V. This leakage current has a linear dependence on the reverse bias, and corresponds to 62.5 MΩ of leakage resistance. The fact that the leakage current density is much higher than $J_0$, and the fact that the leakage current varies linearly with bias, suggests a leakage path in parallel with the Schottky barrier. The leakage is probably via threading dislocations, the density of which can be as high as about $10^9$ cm$^{-2}$.

It should also be mentioned that the reverse breakdown voltage for these Schottky detectors is as high as 20 V. For devices fabricated with higher doping levels in the $n^-$-GaN layers (the upper limit of our experimental range), the reverse (dark) leakage current is higher (about 400 nA) and the reverse breakdown voltage is lower (about 10 V).

Figure 4:
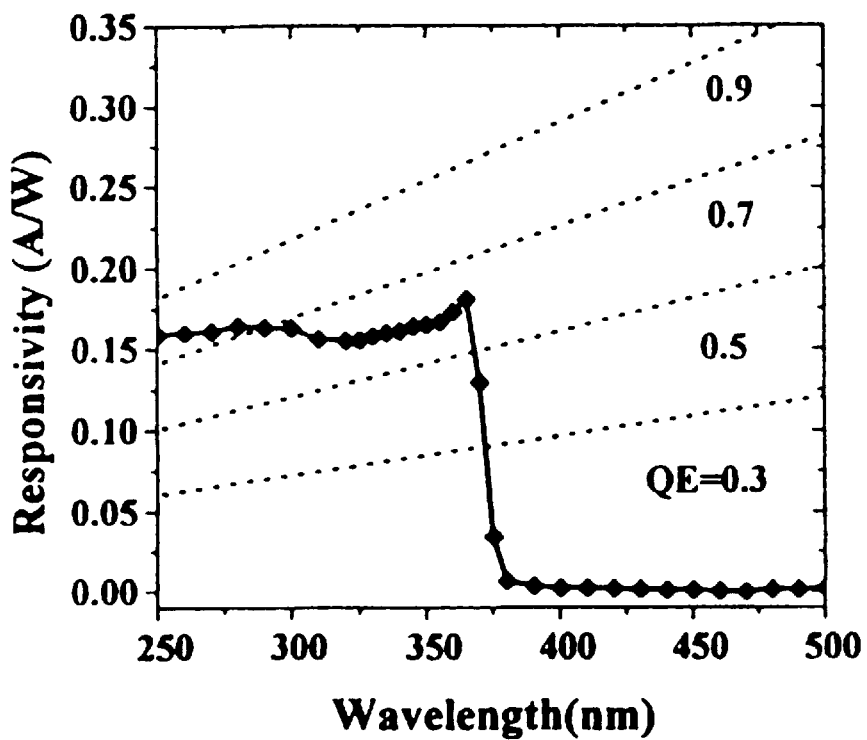
FIG. 4 depicts a spectral response of a vertical Schottky detector under −5 V bias. A responsivity as high as 0.18 A/W was obtained.

FIG. 4 shows the spectral response of the detector. A UV-visible spectrophotometer with a xenon lamp was used for this measurement. The absolute values of the responsivity were obtained using a calibrated silicon detector. For these detectors, the photoresponse at wavelengths longer than 365 nm (the absorption edge of GaN) was not measurable, and the response is nearly constant for wavelengths between 200 and 365 nm. The maximum responsivity was measured to be around 0.18 A/W, corresponding to a total quantum efficiency in excess of 65%.

Figure 5:
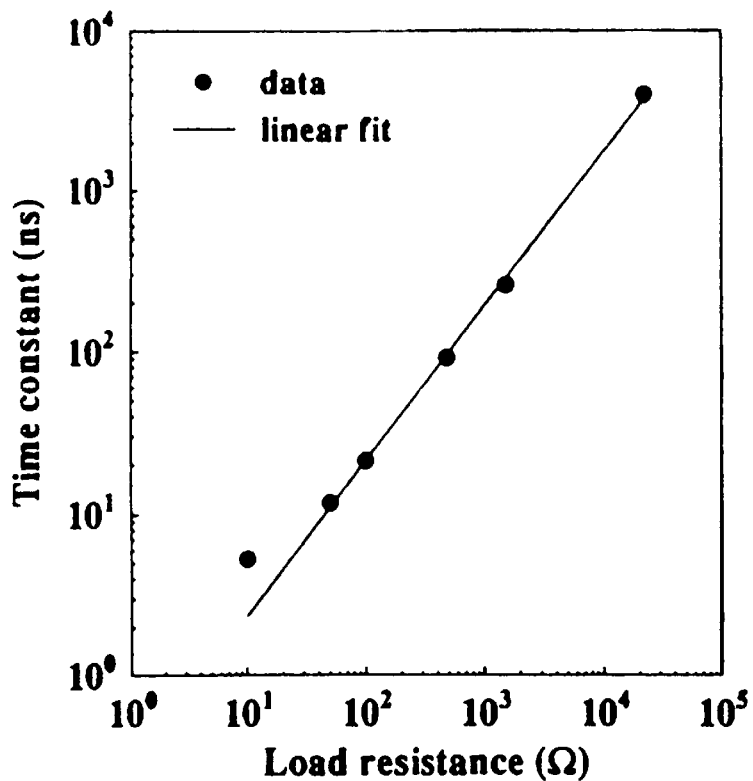
FIG. 5 depicts a photoresponse decay time as a function of load resistance.

The response time of these transparent Schottky detectors was initially measured using a fast mechanical chopper in the beam path of a He-Cd laser. It was found that the fall times (photoresponse decay) were shorter than the transit time of the chopper edge passing across the laser beam (about 10 μs). Consequently, measurements were made using a pulsed nitrogen laser operating at 337 nm. The power of the laser light was attenuated to the density of about 1 W/cm$^2$ or less to avoid any artificial decrease of decay times due to saturation effects. The photoresponse decay across a variable load was acquired using a digital oscilloscope with a bandwidth of 400 MHz. The decay time as a function of the load resistance is plotted in FIG. 5. The linear relationship down to about 50 Ω indicates that the speed is RC limited. For the load resistance of 50 Ω, the time constant is found to be 118 ns corresponding to a bandwidth B=3.0 MHz.

This bandwidth is considerably larger than that measured on lateral Schottky barrier detectors on p-GaN.

Figure 6:
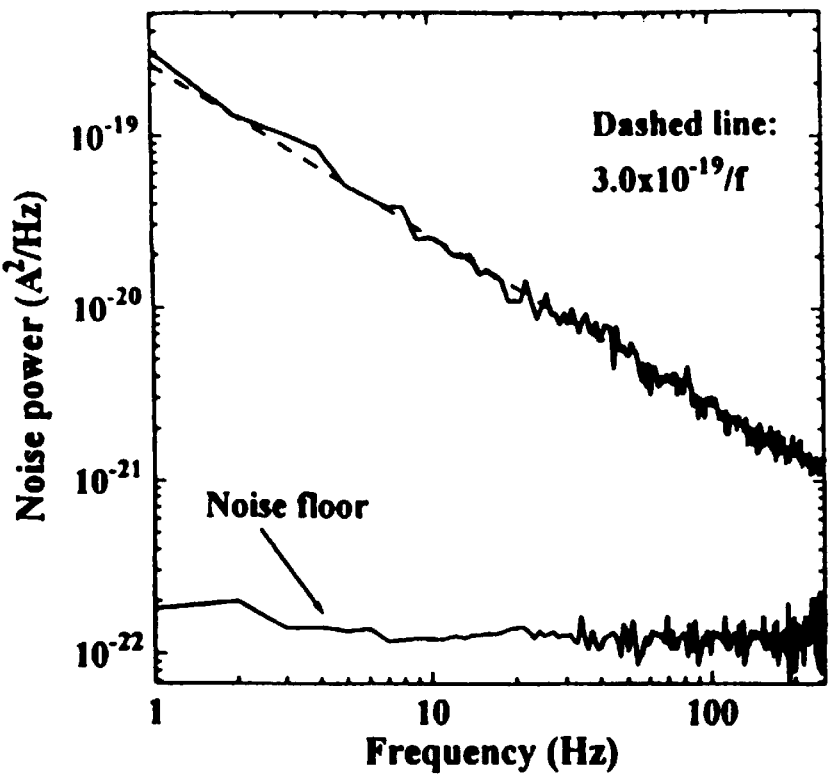
FIG. 6 depicts a measured noise power as a function of frequency for vertical Schottky Detectors. The data have been fitted with $3.0 \times 10^{19}/f$ line, indicating the $1/f$ noise to be the dominant noise contribution.

The noise characteristics of the vertical Schottky detectors were measured by sampling and digitizing, in time domain, the photodetector dark current at a low reverse bias. The spectral density of the noise power was then obtained in the frequency domain using a Fourier transform. A typical noise spectrum obtained on a photodetector with a moderately high leakage current of $4\times10^{-7}$ A is shown in FIG. 6. The measurement was performed at a reverse bias of 1.35 V. The photodetectors exhibit noise power spectral density $S(f)$, which exhibits an almost perfect $1/f$ dependence on frequency: $S(f)=S_0(1/f)$. The characteristic value of $S_0$ was proportional to the square of the average photodiode current: $S_0=A \cdot I^2$. It is, thus, very important to minimize the leakage current in the detector. The value of the coefficient A was different for each device and did not appear to be directly related to the leakage current. For detectors with a low dark current, of the type illustrated in FIG. 3, the noise spectrum is below the floor of our measurement system.

The total $1/f$ noise power generated in the photodetector $P_n$ is given as $$P_n = \langle i_n^2 \rangle R_L,$$

where $i_n$ is the noise current, and $R_L$ is the load resistance. The total noise power is calculated as the area under the noise spectral density curve in the range 0–B Hz, where B is the bandwidth:

$$\langle i_n^2 \rangle = \int_0^B S(f)df$$
$$= \int_0^1 S(f)df + \int_1^B S(f)df$$
$$= S_0 + S_0 \int_1^B \frac{1}{f}df$$
$$= S_0 \cdot (\ln B + 1).$$

The lower frequency limit of our measurement is 1 Hz. For a load of $R_L=600\ \Omega$, we obtain $P_n=2.9\times10^{-15}$ W.

The noise equivalent power (NEP) is commonly used to characterize photodetectors. The NEP is the incident light power necessary to obtain a unity signal-to-noise ratio in the photodetector signal, and is given by:

$$NEP = \frac{\sqrt{\langle i^2 \rangle}}{R}$$

where R is the responsivity of the photodetector. In the case of the detector illustrated in FIG. 3, with R about 0.18 mA/mW at 360 nm, we obtain $NEP=1.2\times10^{-8}$ W. The NEP, when normalized to the square root of the bandwidth, gives $7\times10^{-12}$ W/$\sqrt{Hz}$. Since the noise floor of our experiment is about $1.4\times10^{-22}$ A$^2$/Hz, the NEP for the low leakage devices is estimated at less than $4\times10^{-9}$ W. This value is within the range of typical parameters established for Si based commercial photodiode detectors.

Example 2

This example involves a vertical geometry $Al_xGa_{1-x}N$ Schottky barrier detector with an effective inter-electrode spacing of less than 1 $\mu$m. The epitaxial structure consisted of a 0.7 $\mu$m thick $n^+$-$Al_{0.26}Ga_{0.74}N$ layer followed by a 0.3 $\mu$m thick active layer of $n^-$-$Al_{0.26}Ga_{0.74}N$. The epilayers were deposited over basal plane sapphire substrates at 76 torr and 1000° C. using a low pressure MOCVD system. Triethylaluminum (TEA), trimethylgallium (TEG), and ammonia were used as precursors. Precursor flow rates and growth procedures were identical to those described earlier. Disilane was used as the dopant for the $n^+$-contact layer. Mesa-type Schottky barrier detectors, of different active areas, were then fabricated using Cl-based reactive ion etching (RIE) to define the device. Detector areas ranged from 50 $\mu$m$\times$50 $\mu$m to 500 $\mu$m$\times$500 $\mu$m. Schottky contacts were also fabricated. The ohmic contacts to the bottom $n^{+-Al}_{0.26}Ga_{0.74}N$ layer were made using 200 nm thick Ti/Al/Au and annealed at 900° C. for 30s.

Figure 7:
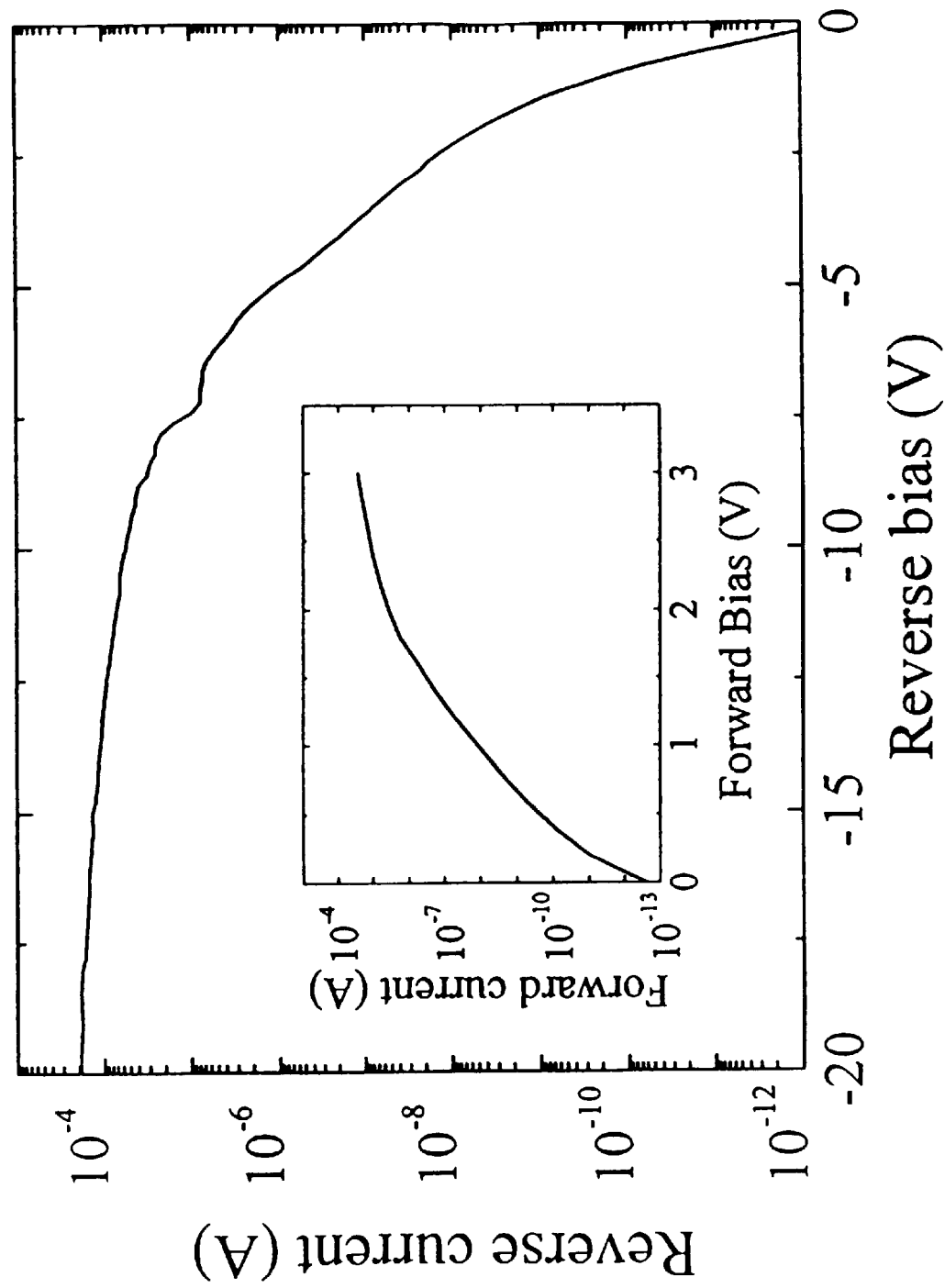
FIG. 7 depicts a graphical representation reverse bias current versus voltage characteristics for a 200 $\mu m \times 200 \mu m$ Schottky barrier AlGaN detector. (Inset) Forward bias characteristics.
Figure 8:
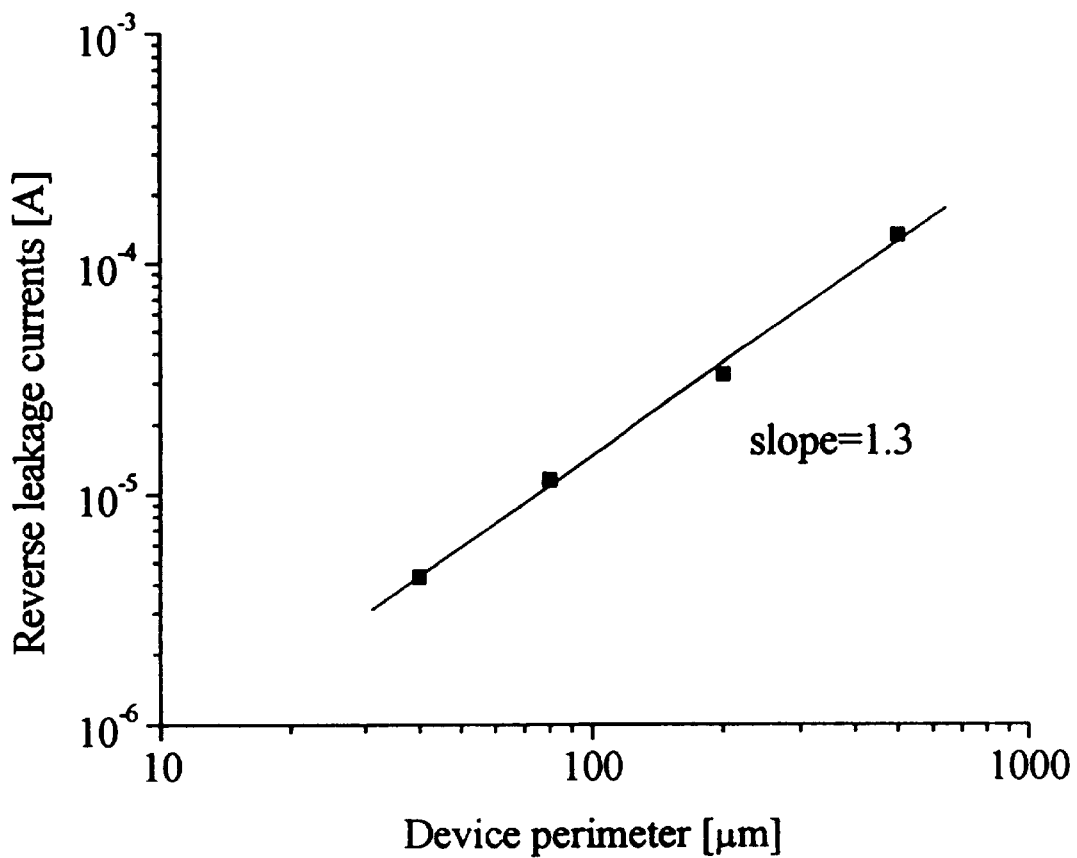
FIG. 8 depicts a graphical representation reverse bias leakage currents versus device perimeter.

The reverse and forward-bias (inset) current-voltage characteristics for a 200 $\mu$m$\times$200 $\mu$m area Schottky barrier detector are shown in FIG. 7. A clear forward-bias turn-on is observed at 1.0 V. The reverse breakdown voltage for all detectors is in excess of 20 V. The reverse leakage currents consistently exhibit an approximately linear dependence on the reverse bias voltage, which suggests the presence of current leakage paths other than the Schottky barrier limited thermionic-emission. To analyze this mechanism, the reverse bias leakage current was plotted in FIG. 8 as a function of the device perimeter. The value of leakage current was obtained by extrapolating the linear portion of the I–V characteristics. The resulting plot is linear with a slope of about one, which implies a proportional dependence of leakage currents on the perimeter of the device. This result suggests surface leakage to be the dominant mechanism contributing to the reverse bias current. The high value of leakage currents, which limits the minimum detectable power of the devices, may be attributed to large density of surface states at the mesa-sidewalls.

Figure 9:
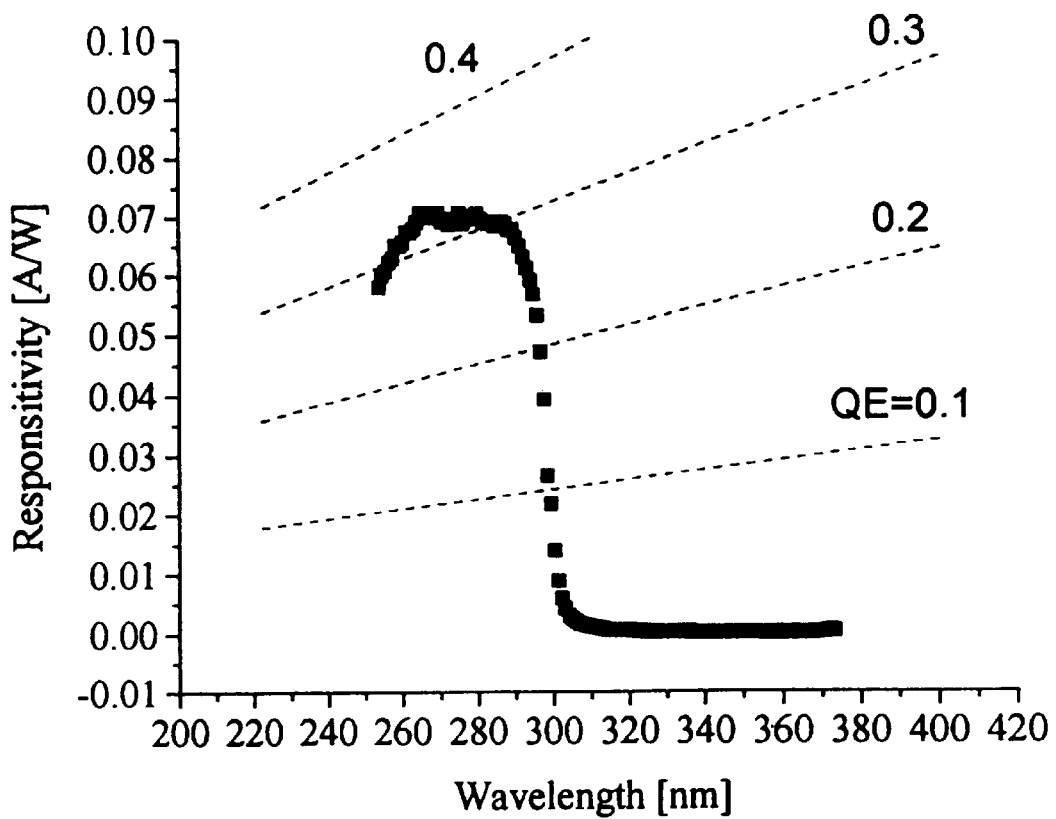
FIG. 9 depicts a graphical representation measured spectral response of Schottky barrier AlGaN detector with an area of 200 μm×200 μm. Dotted lines correspond to external quantum efficiency, $\eta_e=R(\lambda)/(1240.\lambda)$, where $R(\lambda)$ [A/W] is responsivity, and $\lambda$, [nm] is wavelength.

The spectral responsivity of the detectors in the photovoltaic mode was measured using a calibrated 150 W Xe light source and a monochromator. The measured response for a detector with an area of 200 $\mu$m$\times$200 $\mu$m is shown in FIG. 9.

A sharp cut-off was observed at about 290 nm, which is the $Al_{0.26}Ga_{0.74}N$ band edge, with the responsivity falling by orders of magnitude for longer wavelengths. The peak responsivity at 290 nm is estimated to be 0.07 A/W, which remains fairly uniform to about 260 nm. Drop-off in responsivity is caused by decreasing absorption efficiency at shorter wavelengths. This responsivity, which is approximately 0.1 A/W, is comparable to UV-enhanced silicon detectors. From FIG. 9, the external quantum efficiency is estimated to be 30%.

Figure 10:
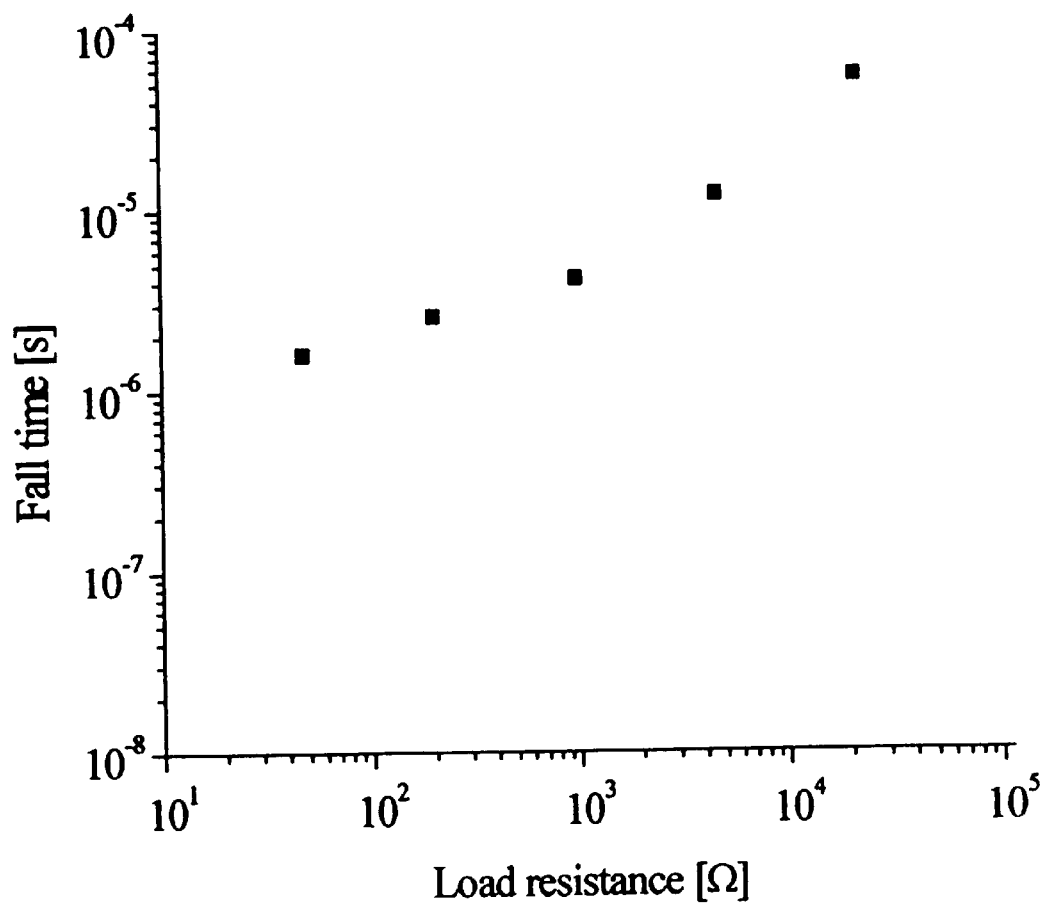
FIG. 10 depicts a detector photosignal decay as a function of load resistance for a Schottky barrier AlGaN detector with an area of 200 μm×200 μm.

The detector speed (again using the 200 $\mu$m$\times$200 $\mu$m device of FIG. 7) was measured using pulsed illumination from an ArF excimer laser operating at 193 nm. The incident laser power was attenuated to avoid any artificial decrease of decay times due to saturation effects. The photosignal decay across a resistive load in series with the detector was measured using a digital oscilloscope with a 400 MHz bandwidth. The decay time (time for the signal to fall from 90% to 10% of the maximum) is plotted as a function of the load resistance in FIG. 10. From the plot, the decay time is RC limited for load resistances down to about 1 k$\Omega$, below which the decay time is device limited.

Figure 11:
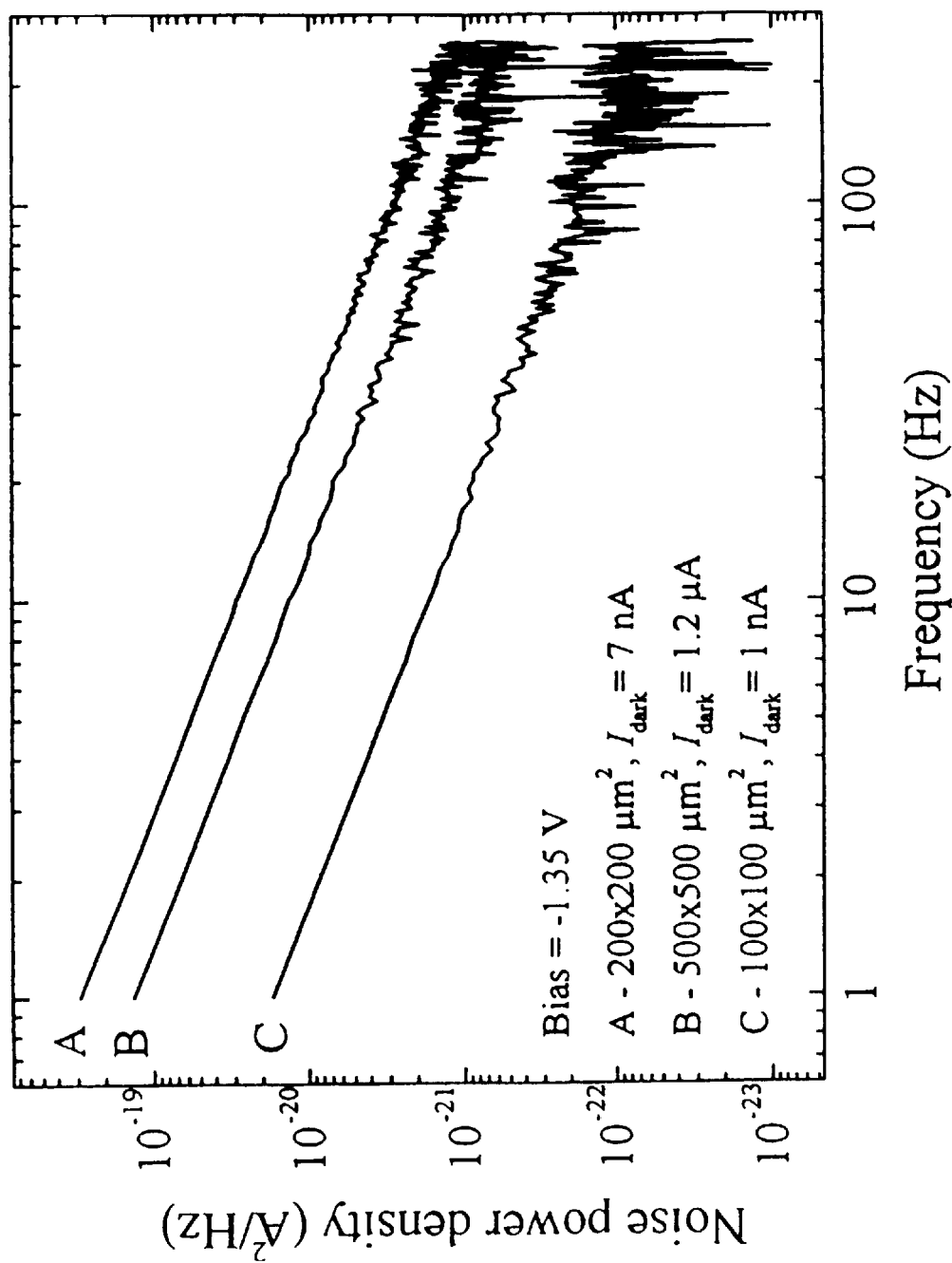
FIG. 11 depicts a low frequency noise measurements carried out on Schottky barrier AlGaN detectors of different sizes.

At a load resistance of 50 $\Omega$, the decay time is 1.6 $\mu$s, which corresponds to a bandwidth of 100 kHz. This bandwidth, although smaller than that of GaN Schottky detectors, is much larger than for the AlGaN photoconductors reported. The noise characteristics of GaN Schottky photodetectors have been investigated, where the noise power spectral density $S(f)$ was found to have a $1/f$ dependence on frequency in the DC to 300 Hz range. The results of noise measurements carried out on Schottky barrier $Al_{0.26}Ga_{0.74}N$ detectors of different sizes are shown in FIG. 11. All detectors exhibit $1/f$ noise. For the 100 $\mu$m$\times$100 $\mu$m device, in which the leakage current reaches 1 nA at −1.35 V, the noise power spectral density was $S_0=1.7\times10^{-20}$ A$^2$/HZ (at f=1 Hz).

For the measured responsivity of 0.07 A/W and a bandwidth B=100 kHz we calculate NEP=6.5×10$^{-9}$ W for the load resistance of R=600 Ω. It is also possible to specify the noise currents at specific frequencies, for example at 10 kHz, $$i_n = \frac{\sqrt{S_0}}{B} = 1.3 \text{ pA}/\sqrt{\text{Hz}}.$$

Example 3

The epitaxial structure for the array of the invention comprises a 1 μm thick Si-doped n$^+$-GaN (N$_d$=2×10$^{18}$ cm$^3$) layer followed by a 1 μm thick i-GaN layer. The epilayers were deposited over basal plane sapphire substrates at 76 torr and 1000° C. using a low pressure MOCVD system.

Figure 12:
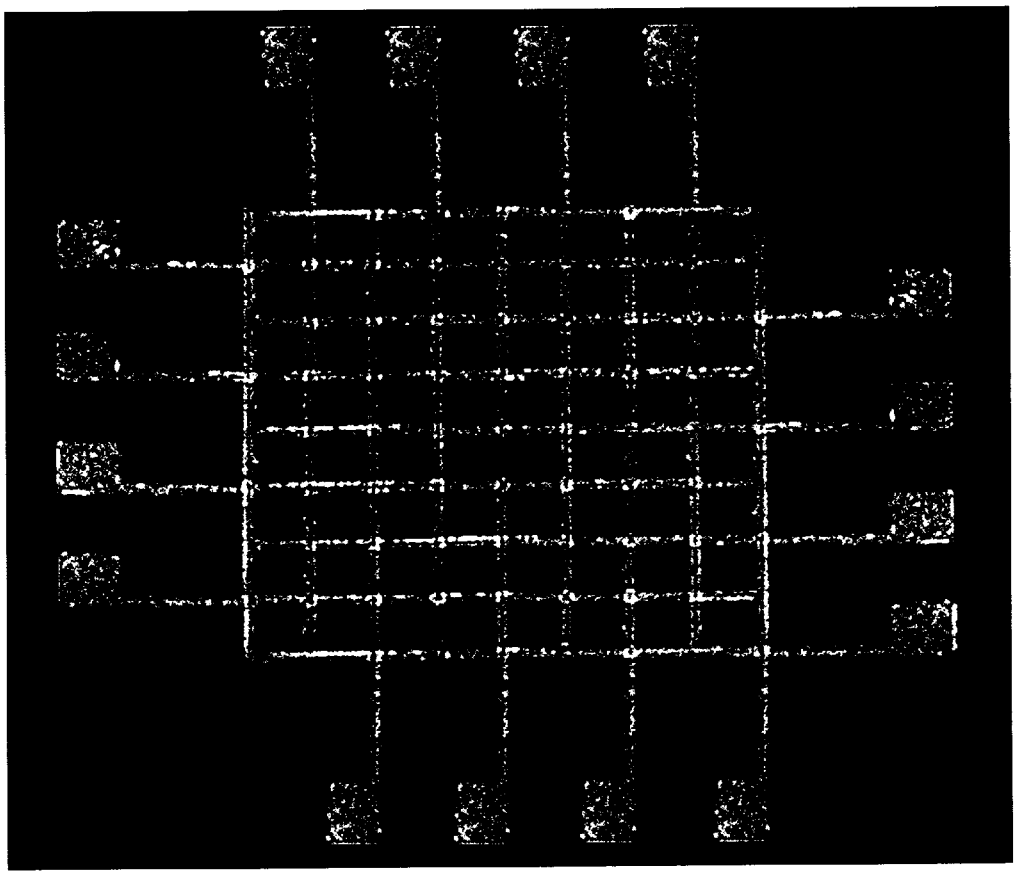
FIG. 12 depicts a SEM of an 8×8 array.

An 8×8 array of mesa type transparent Schottky barrier detectors was then fabricated, using standard photolithography procedures and Cl-based reactive ion etching (RIE) to define the mesa structures with effective pixel area of 200 μm×200 μm. The pixels were fabricated as semitransparent Schottky contacts by depositing a thin (400 Å) layer of Pd on the i-GaN. Pixels of the same row share a common metal line and bonding pad that was deposited on the n$^+$-GaN layer to form the ohmic contact. The Schottky metal contacts of pixels in the same column are interconnected via a second level metal line and bonding pad. The two levels of metals were separated by an 0.3 μm layer of PECVD silicon dioxide. An SEM of the completed array is shown in FIG. 12.

The contact pads of the completed array was wire-bonded to a pin grid array (PGA) to facilitate characterization studies. The photoresponse, spectral response, crosstalk and speed of individual pixels was measured. The responsitivity and crosstalk of each pixel was determined by focusing a low-power He-Cd (λ=325 nm) laser beam to the size of a pixel, and measuring the photocurrent from each pixel using a picoammeter. The average response was about 0.046 A/W with a deviation of 1.91%, and an average dark current of 20 nA at −1V. There were two defective (shorted) pixels, at (0,0) and (6,4), represented with zero response. For pixels which are not in the same row or column as the illuminated pixel, the crosstalk was about −62 dB. However, for pixels in the same row and column, it increases to about −38 dB due to the reverse leakage currents in the common metal lines. This can be minimized by improving the Schottky barrier contacts to reduce reverse leakage currents.

Figure 13:
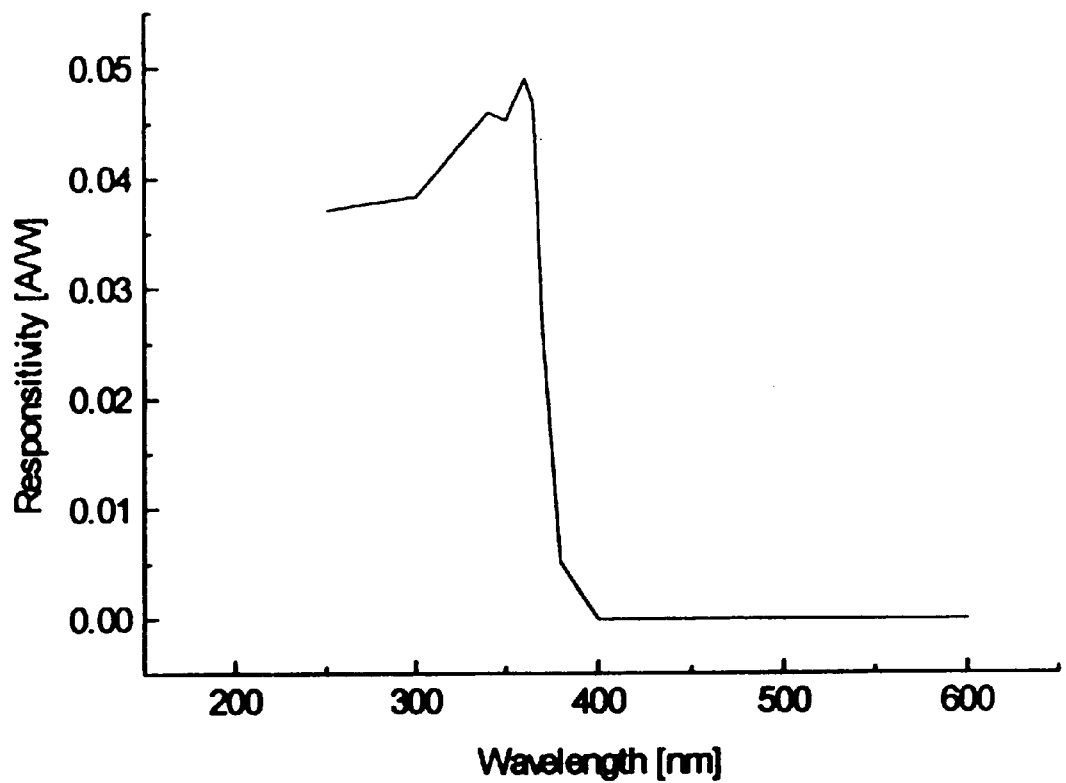
FIG. 13 is a graphical depiction of a spectral response of an array pixel.

The spectral response of a typical pixel was then measured using a UV-VIS spectrophotometer with a xenon light source. The measured photocurrent as a function of wavelength is plotted in FIG. 13. The spectral response shows a sharp peak and cut-off at 360 nm which is the band-edge of the intrinsic active layer. The peak response is about 0.05 A/W. This array is therefore suitable for use in visible-blind applications.

Figure 14:
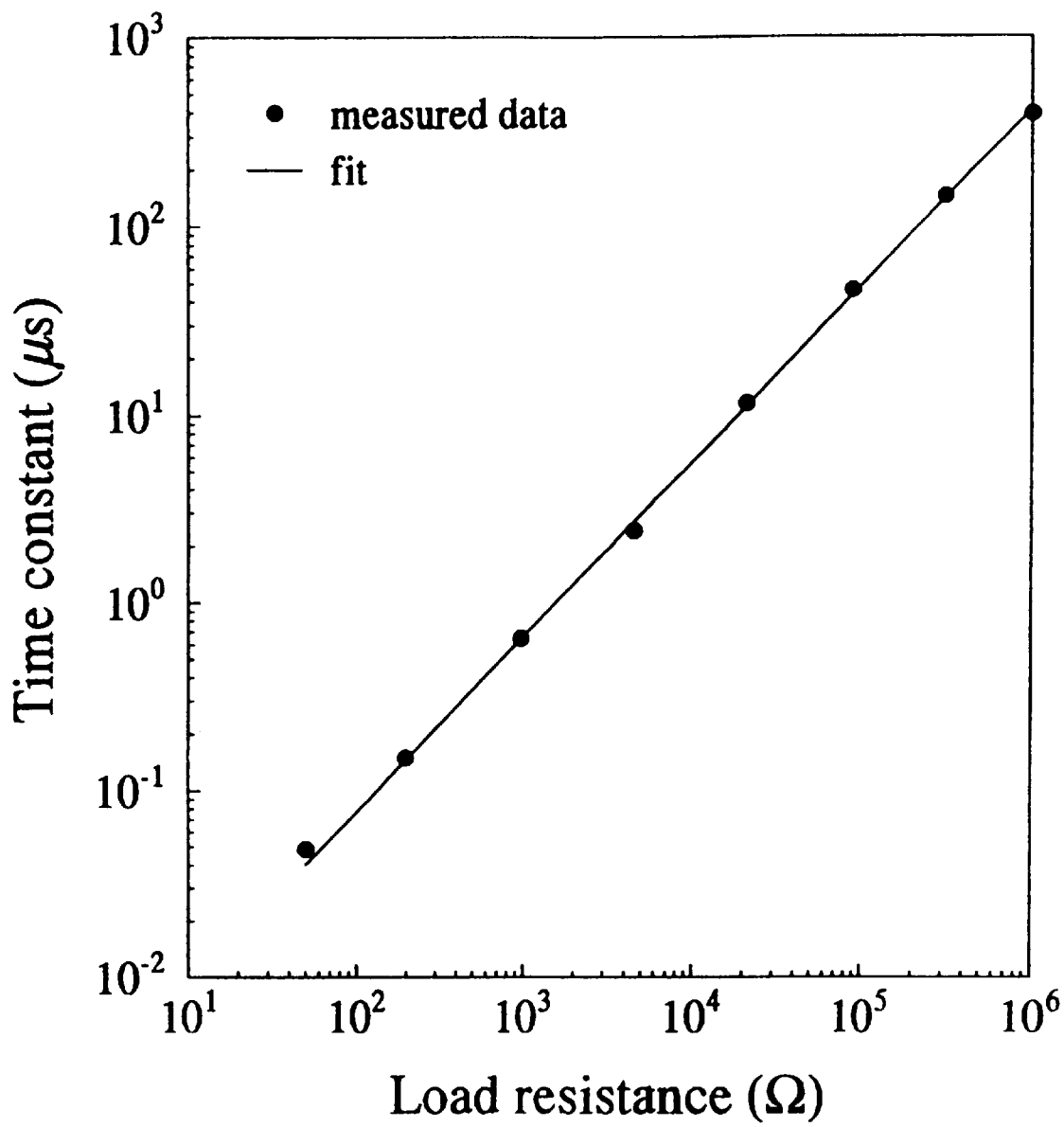
FIG. 14 is a graphical depiction of the decay time constant of a pixel as a function of load resistance.

The speed of the pixels was measured using nanosecond pulses from a nitrogen laser. For this measurement the intensity of the pulsed laser was significantly attenuated to avoid any artificial decrease of decay times due to impurity saturating effects. The decay across a variable load is acquired on a 400 MHz digital oscilloscope, and the decay time as a function of load resistance is plotted in FIG. 14. The linear relationship down to about 50 Ω indicates that the speed is RC limited. For a load resistance of 50 Ω, the time constant is about 50 ns. The fast response times makes it ideal for real-time imaging.

Figure 15:
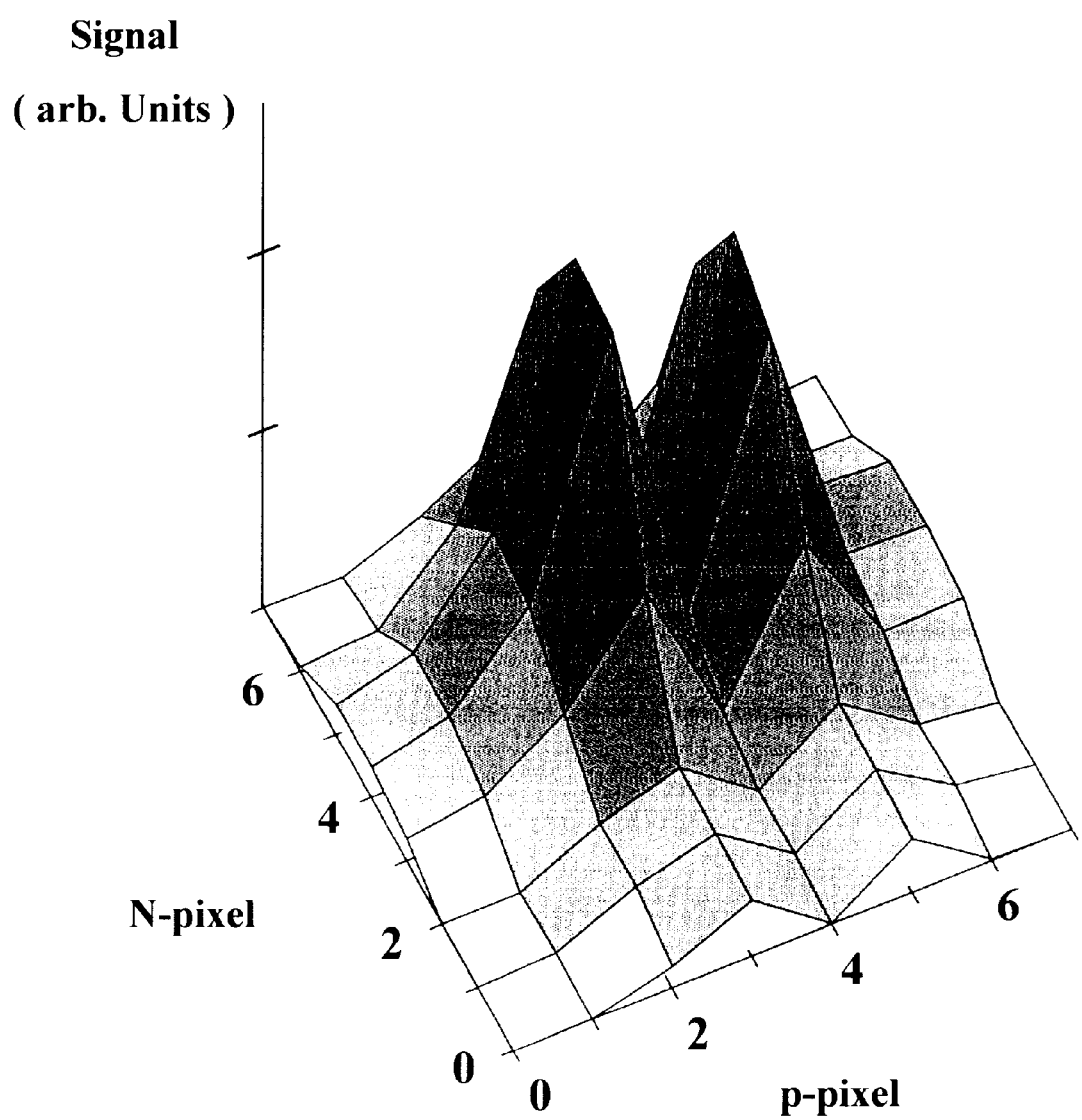
FIG. 15 is a graphical depiction of an image of parallel lines.

The imaging capability of the 8×8 array was tested using UV-illuminated objects. A simple read-out circuitry consisting of multiplexers was constructed to select and read out photocurrent signals from individual pixels. The circuit was driven from a computer that also processed the acquired data and reproduced the image on the screen. Several patterns were used including parallel lines, and circles of varying diameters. FIG. 15 shows the image of parallel lines. As discussed above there is some electrical crosstalk from pixels in the same row and column as the illuminated pixels, which have become more apparent because of the low light levels of the image. This contamination can be greatly reduced at higher intensities where the leakage currents have saturated.

Example 4

This example involves fabrication of a hybrid Detector/HFET combination, in which two electrodes of the UV detector are permanently bonded to two suitable contact points on the HFET using wirebonding techniques. Both of these devices (detector and HFET) were fabricated using epitaxial Al$_x$Ga$_{1-x}$N material, where x was somewhere between 0 and 1, depending on the individual device parameters. The UV radiation was focused on the detector using a lens. Results of the tests show that low levels of UV radiation could be detected. In order to improve the performance of our device, reconfigured HFET devices are currently under fabrication.

The above specification, examples and data provide a complete description of the manufacture and use of the composition of the invention. Since many embodiments of the invention can be made without departing from the spirit and scope of the invention, the invention resides in the claims hereinafter appended.

We claim:

1. A vertical geometry transparent Schottky barrier detector capable of detecting electromagnetic radiation in the range of 200 to 350 nm, said detector comprising several layers grown over basal plane sapphire substrates; said layers sequentially comprising:
 a) a buffer layer comprising AlN;
 b) a n$^+$ doped layer comprising Al$_x$Ga$_{1-x}$N;
 c) a n$^-$ doped active layer comprising Al$_x$Ga$_{1-x}$N; and,
 d) a Schottky layer comprising paladium;
 said detector further comprising ohmic contacts formed on the bottom doped layer.

2. The detector of claim 1 wherein the buffer layer is about 40 nm thick.

3. The detector of claim 1 wherein the n$^+$ doped Al$_x$Ga$_{1-x}$N layer is about 0.5 to 1.5 μm thick.

4. The detector of claim 1 wherein the n$^+$ doped Al$_x$Ga$_{1-x}$N layer is about 1.2 μm thick.

5. The detector of claim 1 wherein the n$^+$ doped Al$_x$Ga$_{1-x}$N layer is doped with Si and has a doping level of about 3×10$^{18}$ cm$^{-3}$.

6. The detector of claim 1 wherein the n$^-$ doped Al$_x$Ga$_{1-x}$N is about 0.3 to 1.5 μm thick.

7. The detector of claim 1 wherein the n$^-$ doped Al$_x$Ga$_{1-x}$N layer is about 0.7 μm thick.

8. The detector of claim 1 wherein the n$^-$ doped Al$_x$Ga$_{1-x}$N layer is doped with Si and has a doping level of about 3×10$^{16}$ to 1×10$^{17}$ cm$^{-3}$.

9. The detector of claim 1 wherein the ohmic contacts are about 215 nm thick and comprise Ti/Al.

10. The detector of claim 1 wherein the palladium level is about 3.5 nm thick.

11. An array of mesa type transparent Schottky barrier detectors suitable for visible-blind imaging; said detectors comprising several layers grown over basal plane sapphire substrates; said layers sequentially comprising:

a) a buffer layer comprising AlN;

b) a n$^+$ doped layer comprising Al$_x$Ga$_{1-x}$N;

c) a n$^-$ doped active layer comprising Al$_x$Ga$_{1-x}$N; and, d) a Schottky layer comprising palladium;

said detectors further comprising ohmic contacts formed on each bottom doped layer.

12. The array of claim 11 wherein each buffer layer is about 40 nm thick.

13. The array of claim 11 wherein each n$^+$ doped Al$_x$Ga$_{1-x}$N layer is about 0.5 to 1.5 µm thick.

14. The array of claim 11 wherein each n$^+$ doped Al$_x$Ga$_{1-x}$N layer is about 1.2 µm thick.

15. The array of claim 11 wherein each n$^+$ doped Al$_x$Ga$_{1-x}$N layer is doped with Si and has a doping level of about 3×10$^{18}$ cm$^{-3}$.

16. The array of claim 11 wherein each n$^-$ doped Al$_x$Ga$_{1-x}$N layer is about 0.3 to 1.5 µm thick.

17. The array of claim 11 wherein each n$^-$ doped Al$_x$Ga$_{1-x}$N layer is about 0.7 µm thick.

18. The array of claim 11 wherein each n$^-$ doped Al$_x$Ga$_{1-x}$N layer is doped with Si and has a doping level of about 3×10$^{16}$ to 1×10$^{17}$ cm$^{-3}$.

19. The array of claim 11 wherein the ohmic contacts are 215 nm thick and comprise Ti/Al.

20. The array of claim 11 wherein each palladium level is about 3.5 nm thick.

* * * * *